(12) United States Patent
Akarvardar et al.

(10) Patent No.: US 9,590,040 B2
(45) Date of Patent: Mar. 7, 2017

(54) METHODS OF FORMING FINS FOR A FINFET DEVICE BY FORMING AND REPLACING SACRIFICIAL FIN STRUCTURES WITH ALTERNATIVE MATERIALS

(71) Applicant: GLOBALFOUNDRIES Inc., Grand Cayman (KY)

(72) Inventors: Murat Kerem Akarvardar, Saratoga Springs, NY (US); Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 354 days.

(21) Appl. No.: 14/341,000

(22) Filed: Jul. 25, 2014

(65) Prior Publication Data

US 2016/0027895 A1    Jan. 28, 2016

(51) Int. Cl.
| | | |
|---|---|---|
| *H01L 29/78* | (2006.01) | |
| *H01L 29/08* | (2006.01) | |
| *H01L 21/84* | (2006.01) | |
| *H01L 29/10* | (2006.01) | |
| *H01L 29/66* | (2006.01) | |

(52) U.S. Cl.
CPC .... *H01L 29/1054* (2013.01); *H01L 29/66795* (2013.01); *H01L 29/7851* (2013.01); *H01L 29/7854* (2013.01)

(58) Field of Classification Search
CPC ............. H01L 29/66545; H01L 29/785; H01L 27/1211; H01L 27/092; H01L 27/0886; H01L 21/84; H01L 29/267; H01L 21/8258; H01L 21/845; H01L 21/823821; H01L 29/1054
USPC .................................................. 438/199, 229
See application file for complete search history.

(56) References Cited

U.S. PATENT DOCUMENTS

| | | | |
|---|---|---|---|
| 8,580,642 B1 | 11/2013 | Maszara et al. | |
| 2014/0145242 A1* | 5/2014 | Huang | H01L 21/82380 257/192 |
| 2014/0264717 A1* | 9/2014 | Shieh | H01L 29/06 257/499 |
| 2015/0295087 A1* | 10/2015 | Cheng | H01L 29/7851 257/192 |

* cited by examiner

*Primary Examiner* — Thomas L Dickey
*Assistant Examiner* — Changhyun Yi
(74) *Attorney, Agent, or Firm* — Amerson Law Firm, PLLC

(57) ABSTRACT

One illustrative method disclosed herein includes, among other things, forming a sacrificial fin structure above a semiconductor substrate, forming a layer of insulating material around the sacrificial fin structure, removing the sacrificial fin structure so as to define a replacement fin cavity in the layer of insulating material that exposes an upper surface of the substrate, forming a replacement fin in the replacement fin cavity on the exposed upper surface of the substrate, recessing the layer of insulating material, and forming a gate structure around at least a portion of the replacement fin exposed above the recessed layer of insulating material.

16 Claims, 10 Drawing Sheets

METHODS OF FORMING FINS FOR A FINFET DEVICE BY FORMING AND REPLACING SACRIFICIAL FIN STRUCTURES WITH ALTERNATIVE MATERIALS

BACKGROUND OF THE INVENTION

1. Field of the Invention

Generally, the present disclosure relates to the manufacture of FET semiconductor devices, and, more specifically, to various methods of forming fins for a FinFET semiconductor device by forming and replacing sacrificial fin structures with alternative materials.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region and a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a planar FET, there are so-called 3D devices, such as an illustrative FinFET device, which is a three-dimensional structure. FIG. 1A is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of trenches 13, three illustrative fins 14, a gate structure 16, sidewall spacers 18 and a gate cap layer 20. An isolation material 17 provides electrical isolation between the fins 14. The gate structure 16 is typically comprised of a layer of insulating material (not separately shown), e.g., a layer of high-k insulating material, and one or more conductive material layers that serve as the gate electrode for the device 10. The fins 14 have a three dimensional configuration: a height H, a width W and an axial length L. The axial length L corresponds to the direction of current travel in the device 10 when it is operational. The portions of the fins 14 covered by the gate structure 16 are the channel regions of the FinFET device 10. The portions of the fins 14 that are positioned outside of the spacers 18 will become part of the source/drain regions of the device 10.

In the FinFET device 10, the gate structure 16 encloses both sides and the upper surface of all or a portion of the fins 14 to form a tri-gate structure so as to use a channel having a three-dimensional structure instead of a planar structure. In some cases, an insulating cap layer, e.g., silicon nitride, is positioned at the top of the fins 14 and the FinFET device only has a dual-gate structure (sidewalls only). Unlike a planar FET, in a FinFET device, a channel is formed perpendicular to a surface of the semiconducting substrate so as to increase the drive current per footprint of the device. Also, in a FinFET, the improved gate control through multiple gates on a narrow, fully-depleted semiconductor fin significantly reduces the short channel effects. When an appropriate voltage is applied to the gate electrode 16 of a FinFET device 10, the surfaces (and the inner portion near the surface) of the fins 14, i.e., the vertically oriented sidewalls and the top upper surface of the fin, form a surface inversion layer or a volume inversion layer that contributes to current conduction. Accordingly, for a given plot space (or foot-print), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. Device designers are currently investigating alternative semiconductor materials, such as so-called SiGe, Ge and III-V materials, to manufacture FinFET devices, which are intended to enhance the performance capabilities of such devices, e.g., to enable low-voltage operation without degrading their operating speed.

FIG. 1B is a perspective view of an illustrative prior art FinFET semiconductor device 10, wherein the overall fin structure of the device includes a substrate fin portion 14A and an alternative fin material portion 14B. As with the case above, the substrate fin portion 14A may be made of silicon, i.e., the same material as the substrate, and the alternative fin material portion 14B may be made of a material other than the substrate material, for example, silicon-germanium. As noted above, the use of such alternative fin materials improve the mobility of charge carriers in the device.

However, the integration of such alternative materials on silicon substrates (the dominant substrates used in the industry) is non-trivial due to, among other issues, the large difference in lattice constants between such alternative materials and silicon. That is, with reference to FIG. 1B, the lattice constant of the alternative fin material portion 14B of the fin 14 may be substantially greater than the lattice constant of the substrate fin portion 14A of the fin 14. As a result of this mismatch in lattice constants, an unacceptable number of defects may be formed or created in the alternative fin material portion 14B. As used herein, a "defect" essentially refers to a misfit dislocation at the interface between the portions 14A and 14B of the fin 14 or threading dislocations that propagate through the portion 14B on the fin 14 at well-defined angles corresponding to the (111) plane.

One of the proposed approaches for the formation of alternative materials for FinFET devices will now be discussed with reference to FIGS. 1C-1G, which are cross-sectional views of the fins taken in a gate width direction of the device 10. As shown in FIG. 1C, the initial fin structures 14 are formed in the substrate 12 by performing an etching process through a patterned etch mask 15. FIG. 1D depicts the device 10 after the layer of insulating material 17 was deposited in the trenches 13 and one or more CMP processes was performed to remove the etch mask 15 and excess amounts of the layer of insulating material 17. These operations expose the upper surface of the fins 14. Next, as shown in FIG. 1E, a timed recessing etching process is performed to remove a portion of the initial fins 14 (now denoted as fins 14A) such that they have a recessed upper surface 14R. Thereafter, as shown in FIG. 1F, the alternative fin material 14B is grown on the recessed fin structures by performing a selective epitaxial deposition process. FIG. 1G depicts the device after a recess etching process was performed on the layer of insulating material 17 such that it has a recessed upper surface 17R that exposes the desired amount of the alternative fin material 14B. At the point of processing depicted in FIG. 1G, traditional manufacturing processes are then performed to form the gate structure 16, gate cap layer 20 and sidewall spacers 18.

There are several problems with this prior art process flow, particularly as it relates to the control of the timed recess etching process. For example, the fin structures in modern FinFET devices are typically 70-150 nm tall and narrower than about 10 nm in width. Thus, attempting to precisely control a timed recess etching process on such a small volume of fin material, when attempting to remove approximately half of the fin height, is very challenging under the best of circumstances and conditions. Additionally, many integrated circuit products employ FinFET devices with different fin pitches in different parts of the product, such as SRAM and logic circuits. This is problematic because, typically, all of the fins are formed across the substrate in a common etching process. However, due to different fin pitches in different regions of the substrate, etch-loading effects may cause differences in the height and/or width of the fins in the different regions of the device. This is an additional variable that must be accounted for when performing the timed recess etching process on fins in such different regions of the device.

The present disclosure is directed to various methods of forming fins for a FinFET semiconductor device by forming and replacing sacrificial fin structures with alternative materials that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming fins for a FinFET semiconductor device by forming and replacing sacrificial fin structures with alternative materials. One illustrative method disclosed herein includes, among other things, forming a sacrificial fin structure on a surface of a semiconductor substrate, forming a layer of insulating material around the sacrificial fin structure, performing at least one etching process to remove the sacrificial fin structure and thereby define a replacement fin cavity in the layer of insulating material that exposes an upper surface of the substrate, selectively growing a replacement fin in the replacement fin cavity on the exposed upper surface of the substrate, recessing the layer of insulating material so as to thereby expose at least an upper portion of the replacement fin, and forming a gate structure around at least a portion of the replacement fin exposed above the recessed layer of insulating material.

Another illustrative method disclosed herein includes, among other things, forming at least one layer of a sacrificial fin material on a surface of a semiconductor substrate, patterning the at least one layer of sacrificial fin material so as to thereby define a sacrificial fin structure, forming a layer of insulating material around the sacrificial fin structure, performing at least one etching process to remove the sacrificial fin structure and thereby define a replacement fin cavity in the layer of insulating material that exposes an upper surface of the substrate, performing an epitaxial deposition process to form a replacement fin in the replacement fin cavity on the exposed upper surface of the substrate, recessing the layer of insulating material so as to thereby expose at least an upper portion of the replacement fin, and forming a gate structure around at least a portion of the replacement fin exposed above the recessed layer of insulating material.

Yet another illustrative method disclosed herein includes, among other things, forming at least one layer of a sacrificial fin material on a surface of a semiconductor substrate, forming a patterned etch mask layer above the at least one layer of sacrificial fin material, performing at least one etching process though the patterned etch mask to remove portions of the at least one layer of sacrificial fin material so as to thereby define a sacrificial fin structure, and forming a layer of insulating material around the sacrificial fin structure. In this embodiment, the method further includes performing at least one process operation to expose an upper surface of the sacrificial fin structure, performing at least one etching process to remove the sacrificial fin structure and thereby define a replacement fin cavity in the layer of insulating material that exposes an upper surface of the substrate, performing an epitaxial deposition process to form a replacement fin in the replacement fin cavity on the exposed upper surface of the substrate, recessing the layer of insulating material so as to thereby expose at least an upper portion of the replacement fin, and forming a gate structure around at least a portion of the replacement fin exposed above the recessed layer of insulating material.

BRIEF DESCRIPTION OF THE DRAWINGS

The disclosure may be understood by reference to the following description taken in conjunction with the accompanying drawings, in which like reference numerals identify like elements, and in which.

Figure 1A:
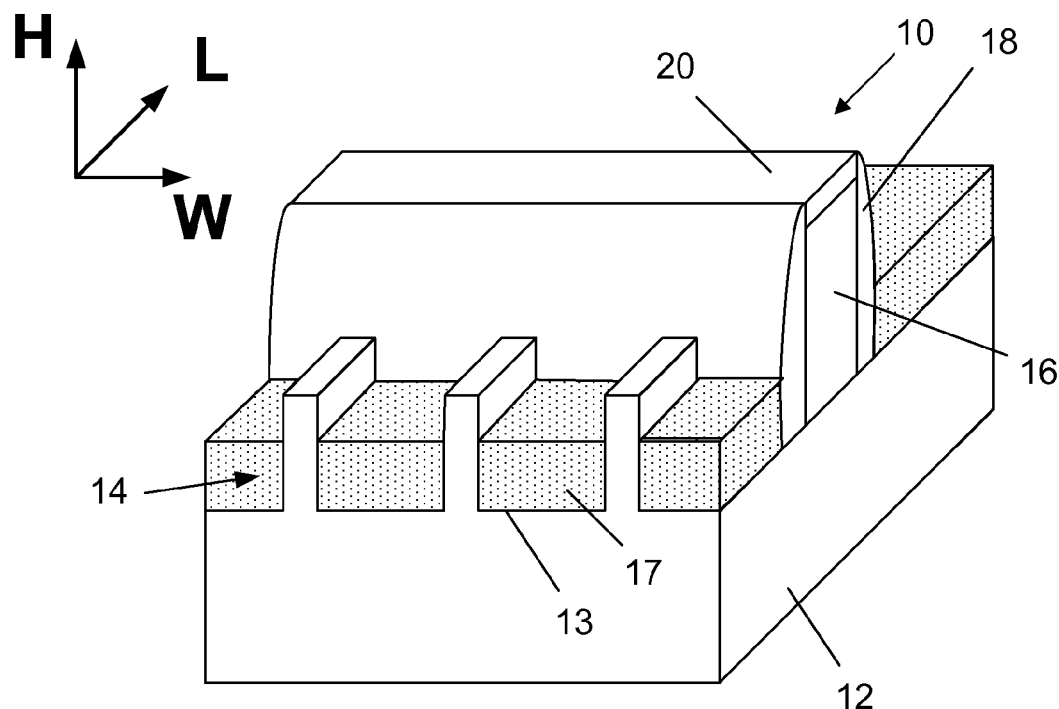
FIG. 1A depicts an example of prior art FinFET devices wherein the fins for the device are comprised of the substrate material.
Figure 1B:
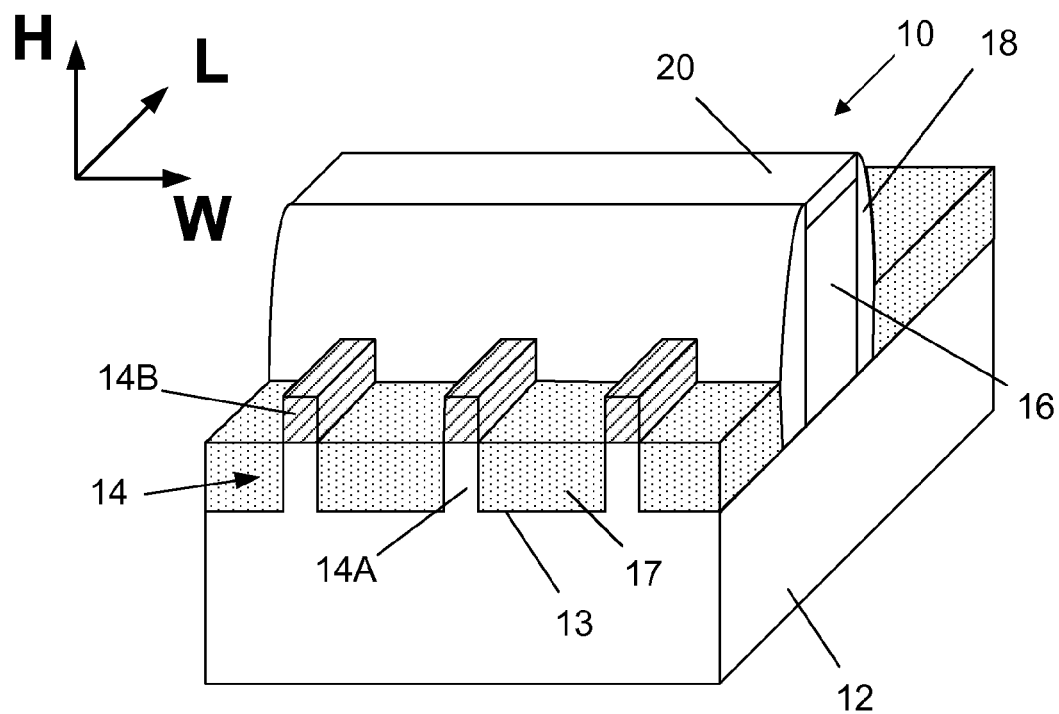
FIG. 1B depicts an example of prior art FinFET devices wherein the fins for the device are comprised of an alternative fin material formed above a substrate fin.
Figure 1C:
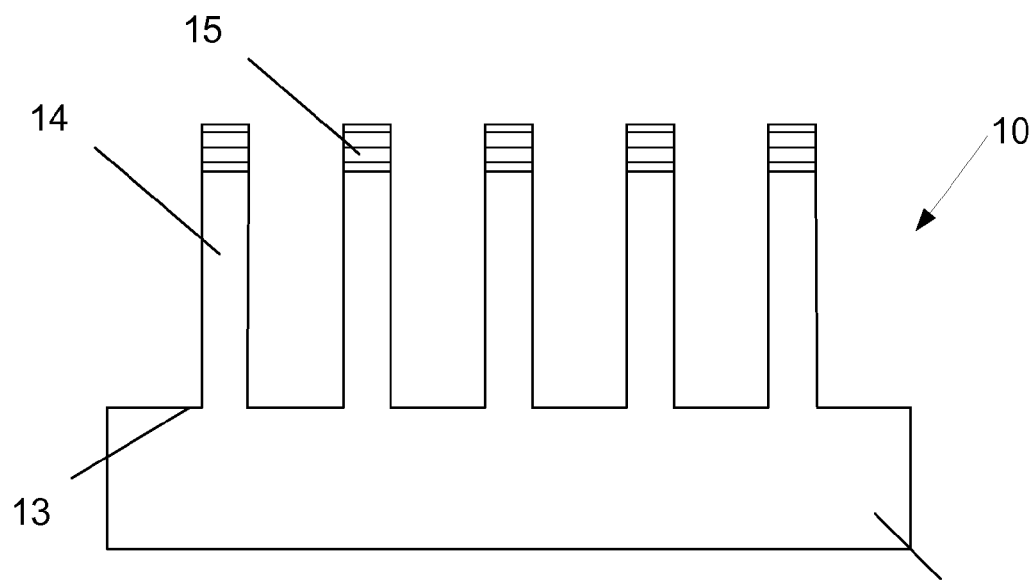
FIGS. 1C-1G depict one illustrative prior art process flow for forming alternative fin materials on FinFET devices.
Figure 1D:
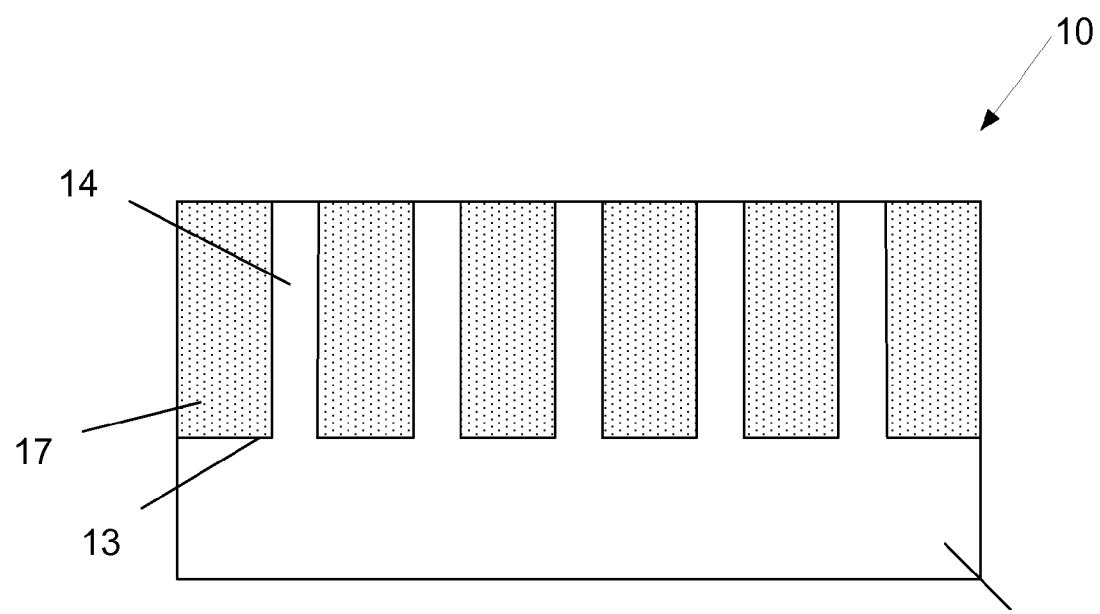
Figure 1E:
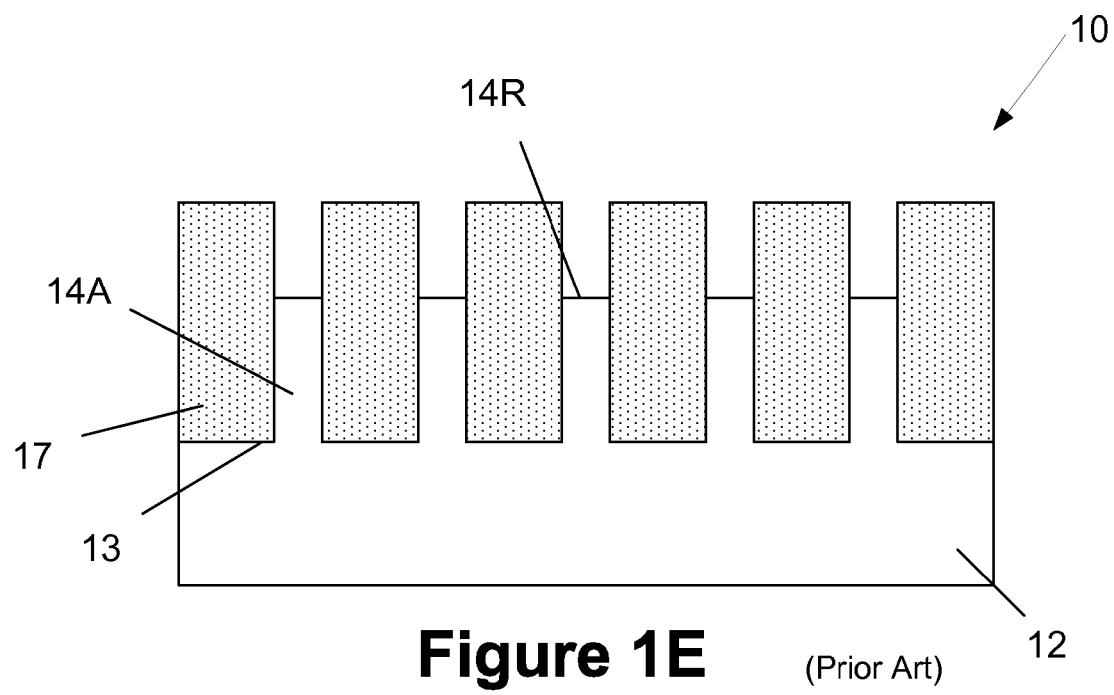
Figure 1F:
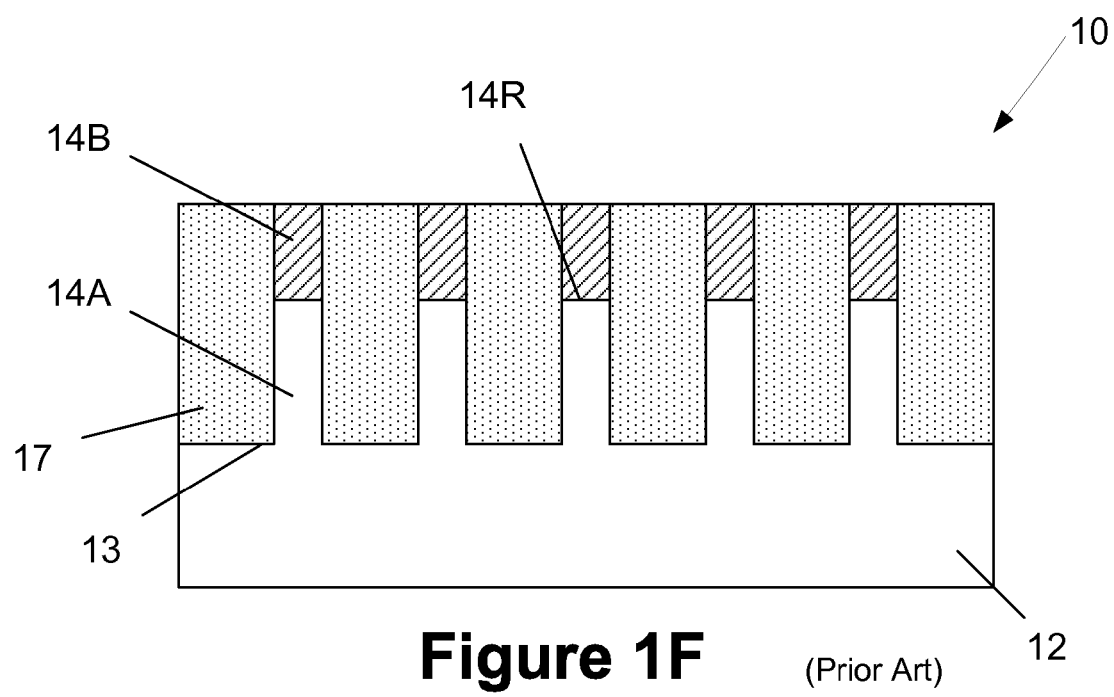
Figure 1G:
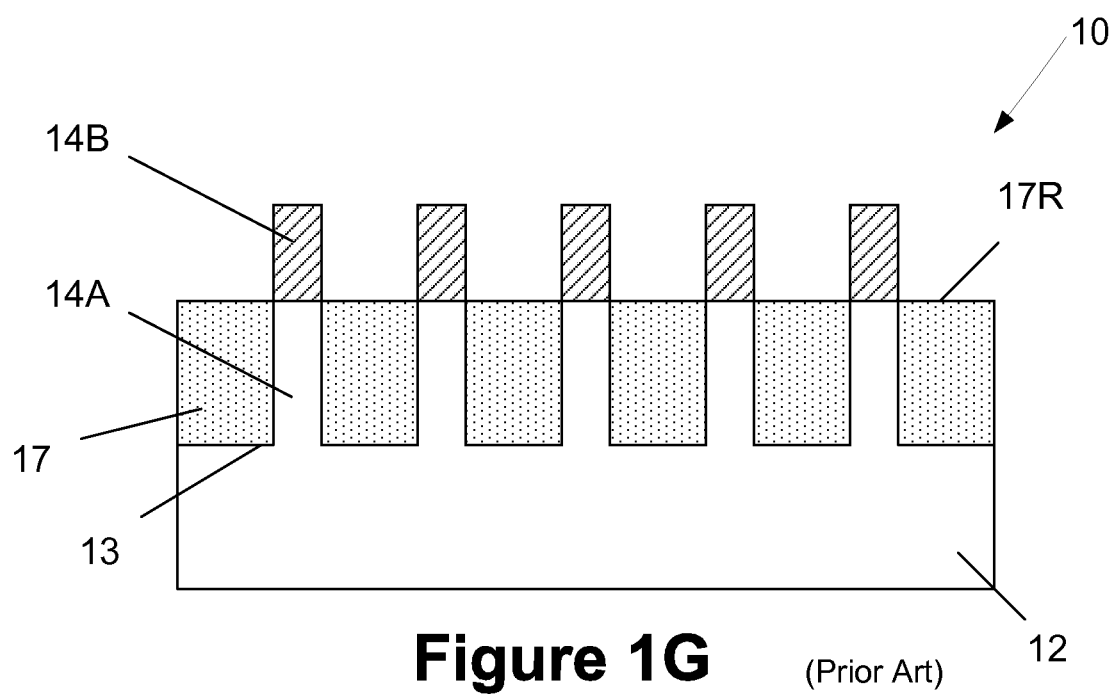

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to methods of forming fins for a FinFET semiconductor device by forming and replacing sacrificial fin structures with alternative materials. The methods disclosed herein may be employed in manufacturing either an N-type device or a P-type device, and the gate structure of such devices may be formed using either so-called "gate-first" or "replacement gate" ("gate-last" or "gate-metal-last") techniques. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

Figure 2A:
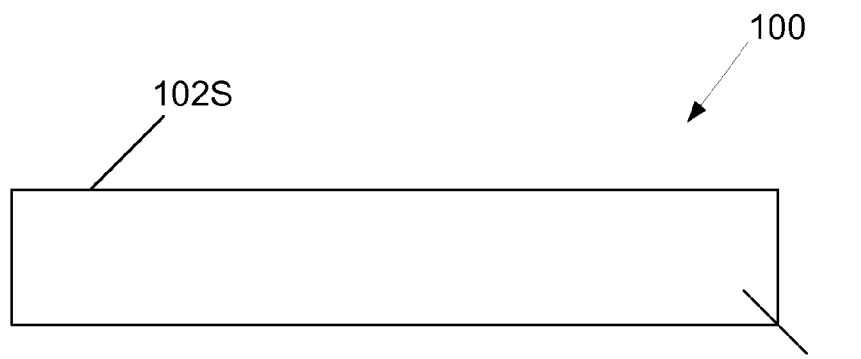
FIGS. 2A-2M depict various illustrative novel methods disclosed herein for forming fins for a FinFET semiconductor device by forming and replacing sacrificial fin structures with alternative materials.

FIGS. 2A-2M depict various illustrative novel methods disclosed herein for forming a FinFET semiconductor device by forming and replacing sacrificial fin structures with alternative materials. With reference to FIG. 2A, the device 100 is depicted as being formed above a semiconductor substrate 102 comprised of a semiconductor material, such as, for example, a bulk silicon substrate, having an upper surface 102S. Thus, the terms "substrate," "semiconductor substrate" or "semiconducting substrate" should be understood to cover all semiconductor materials. An isolation material (not shown) may be formed in the substrate 102 to define spaced-apart active regions in the substrate 102. The isolation regions may be formed using traditional techniques, e.g., traditional shallow trench isolation regions may be formed in the substrate 102. In the case of the illustrative FinFET devices disclosed herein, the isolation regions may be formed before or after the formation of the fin structures that will be formed as described more fully below.

Figure 2B:
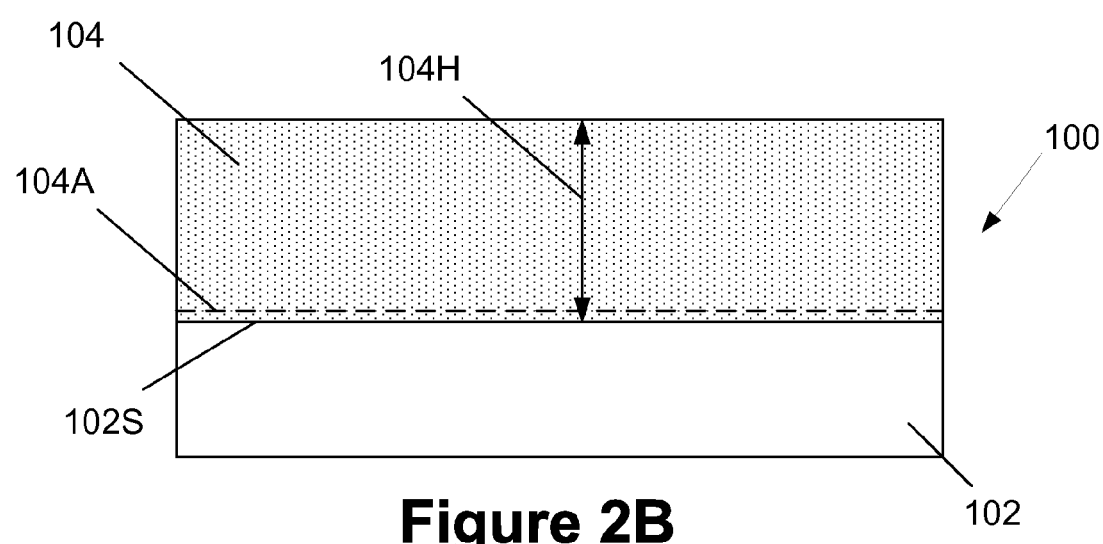

FIG. 2B depicts the device 100 after one or more layers of sacrificial fin material 104 were formed on the surface of the substrate 102. In some embodiments, at least one layer of sacrificial fin material 104 may be comprised of a plurality of layers of material. For example, in the case where the sacrificial layer of material is comprised of silicon nitride, and the substrate 102 is comprised of silicon, the at least one layer of sacrificial fin material 104 may comprise an additional sacrificial layer of material 104A, depicted in dashed lines only in FIG. 2A so as not to obscure the presently disclosed inventions. For example, in one embodiment, the sacrificial fin material layer 104 may be a layer of silicon nitride and the layer 104A may be a layer of silicon dioxide that is actually formed on and in contact with the surface 102S of the substrate 102. The number and composition of the layers of material that comprise the sacrificial fin material layer 104 may vary depending upon the particular application. The overall height 104H of the sacrificial fin material layer 104 may vary depending upon the particular application as well as the desired final height of the fins for the device 100.

Figure 2C:
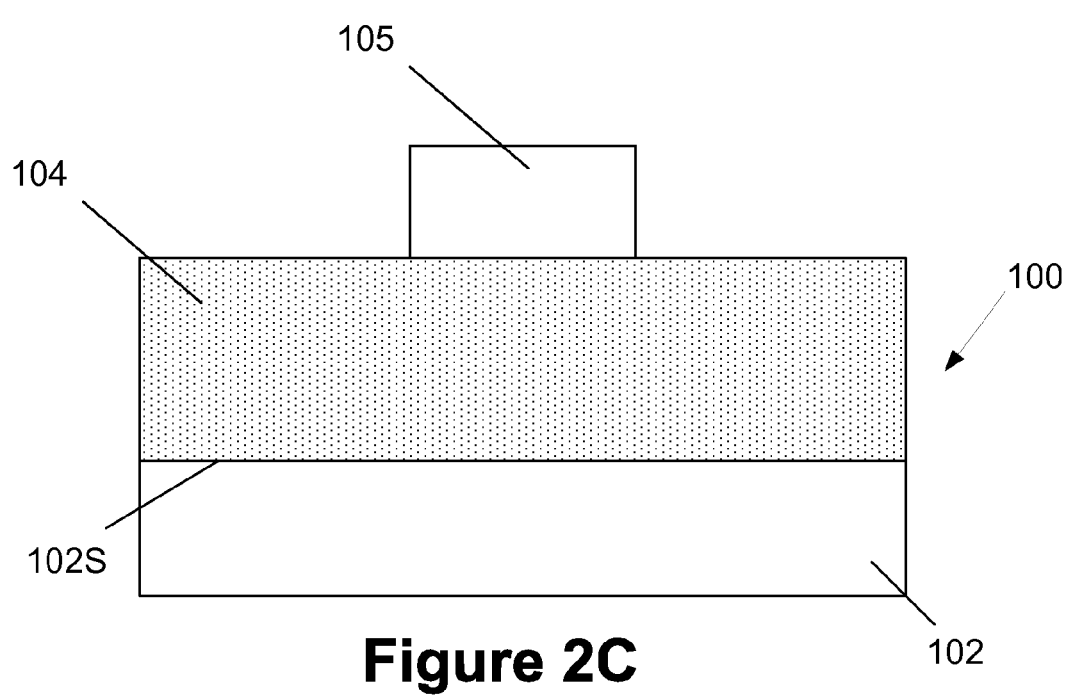

The sacrificial fins for the device 100 will be formed using a patterned etch mask that is formed using sidewall image sidewall image transfer techniques, which is the current state-of-the-art means of achieving tight fin pitches substantially below 100 nm. Accordingly, FIG. 2C depicts the device 100 after a mandrel 105 has been formed above the sacrificial fin material layer 104. The mandrel 105 may be formed by depositing a layer of mandrel material, e.g., amorphous silicon, polysilicon, and thereafter patterning the layer of mandrel material using know patterning and etching techniques.

Figure 2D:
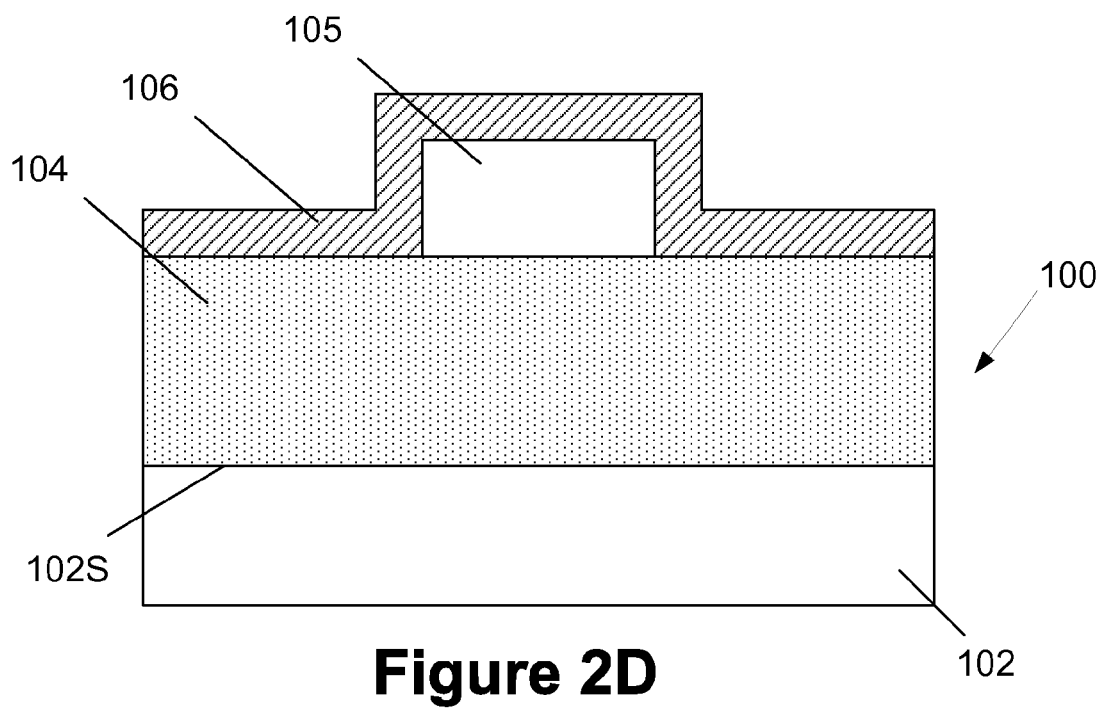

FIG. 2D depicts the device 100 after a layer of spacer material 106, e.g., silicon dioxide, was conformably deposited on the device and around the mandrel 105. The layer of spacer material 106 may be formed to any desired thickness.

Figure 2E:
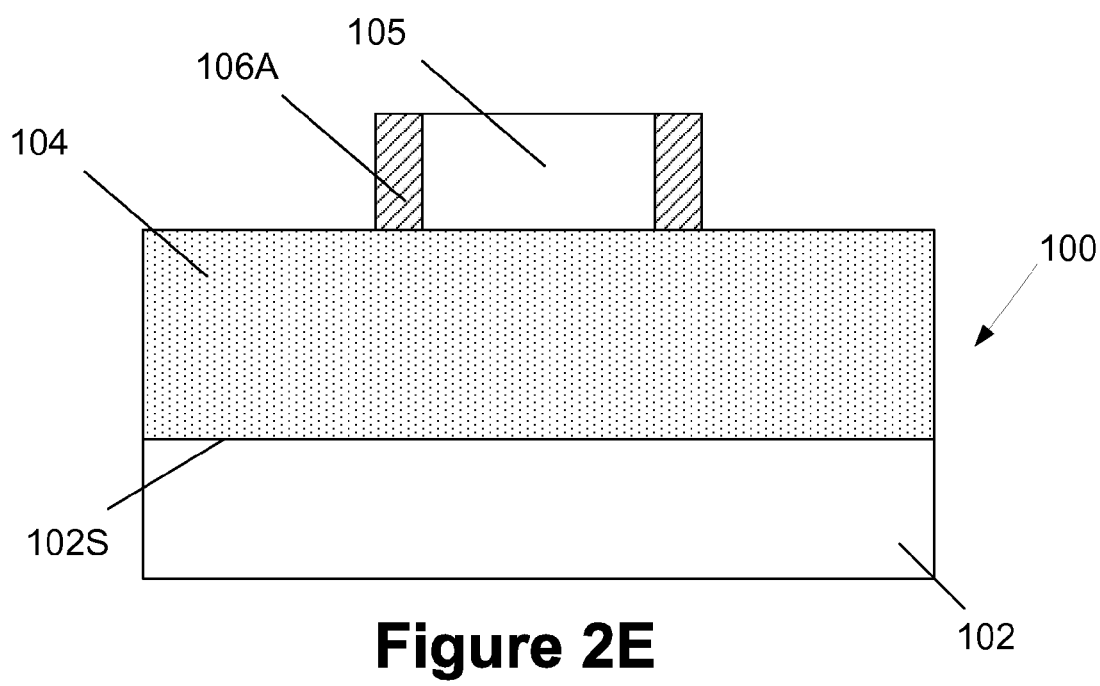

FIG. 2E depicts the device after an anisotropic etching process was performed on the layer of spacer material 106 to define sidewalls spacers 106A positioned adjacent the mandrel 105.

Figure 2F:
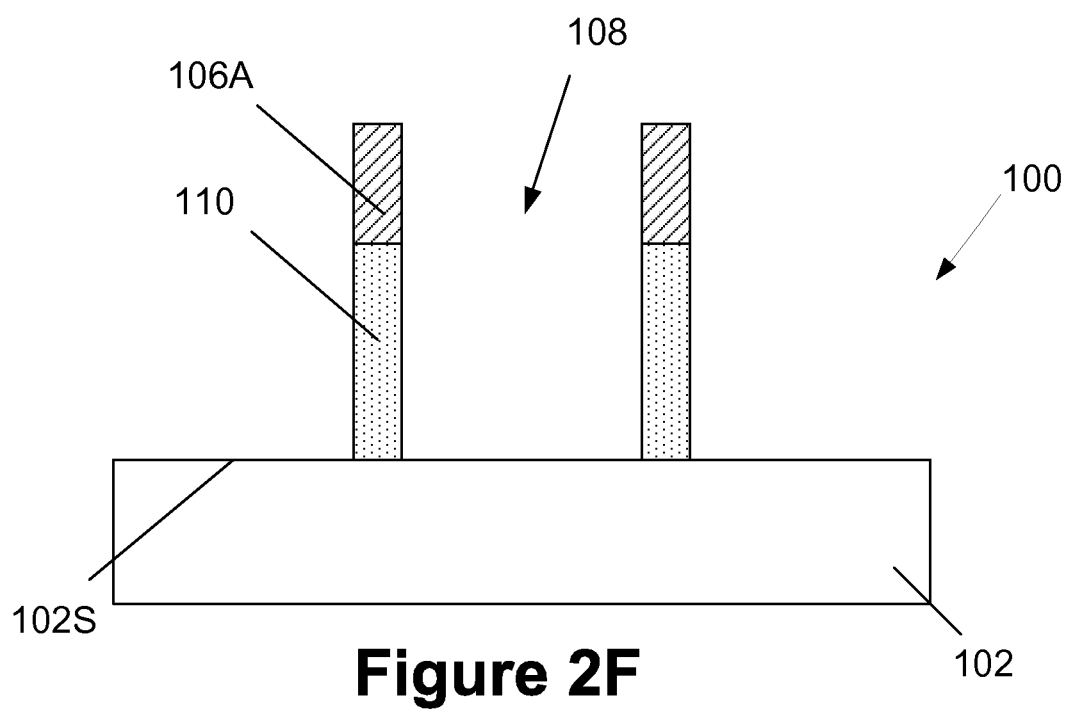

FIG. 2F depicts the device after several process operations were performed. First, a selective etching process was performed to remove the mandrel 105 selectively to the surrounding structures. Removal of the mandrel 105 results in the formation of a patterned etch mask, i.e., the collection of sidewall spacers 106A, positioned above the sacrificial fin material layer 104. The patterned etch mask has a plurality of features, i.e., the spacers 106A, with a pitch that corresponds to the desired pitch between the sacrificial and final fin structures to be formed on the device 100.

With continuing reference to FIG. 2F, one or more etching processes, e.g., anisotropic etching processes, were performed through a patterned etch mask to pattern the at least one layer of sacrificial fin material 104 to thereby define a plurality trenches 108 in at least one layer of sacrificial fin material 104 and a plurality of sacrificial fin structures 110. The width and height of the sacrificial fin structures 110 may vary depending upon the particular application. Additionally, the overall size, shape and configuration of the trenches 108 and sacrificial fin structures 110 may vary depending on the particular application. In one illustrative embodiment, based on current day technology, the depth of the trenches 108 may range from approximately 50-150 nm and the width of the trenches 108 may be about 40 nm or less. In some embodiments, the sacrificial fin structures 110 may have a final width within the range of about 10 nm. Of course, the above numbers are provided by way of example, and the formation of sacrificial fin structures 110 should not be considered to be limited to such examples.

In the illustrative examples depicted in the attached drawings, the trenches 108 and the sacrificial fin structures 110 are all depicted as having a uniform size and shape. However, such uniformity in the size and shape of the trenches 108 and the sacrificial fin structures 110 is not required to practice at least some aspects of the inventions disclosed herein. In the attached figures, the trenches 108 are depicted as having been formed by performing an anisotropic etching process that results in the sacrificial fin structures 110 having a schematically depicted, generally rectangular configuration. In an actual real-world device, the sidewalls of the sacrificial fin structures 110 may be somewhat outwardly tapered, although that configuration is not depicted in the attached drawings. Thus, the size and configuration of the trenches 108 and the sacrificial fin structures 110, and the manner in which they are made, should not be considered a limitation of the present invention. For ease of disclosure, only the substantially rectangular trenches 108 and sacrificial fin structures 110 will be depicted in the subsequent drawings. Moreover, the device 100 may be formed with any desired number of sacrificial fin structures 110.

Figure 2G:
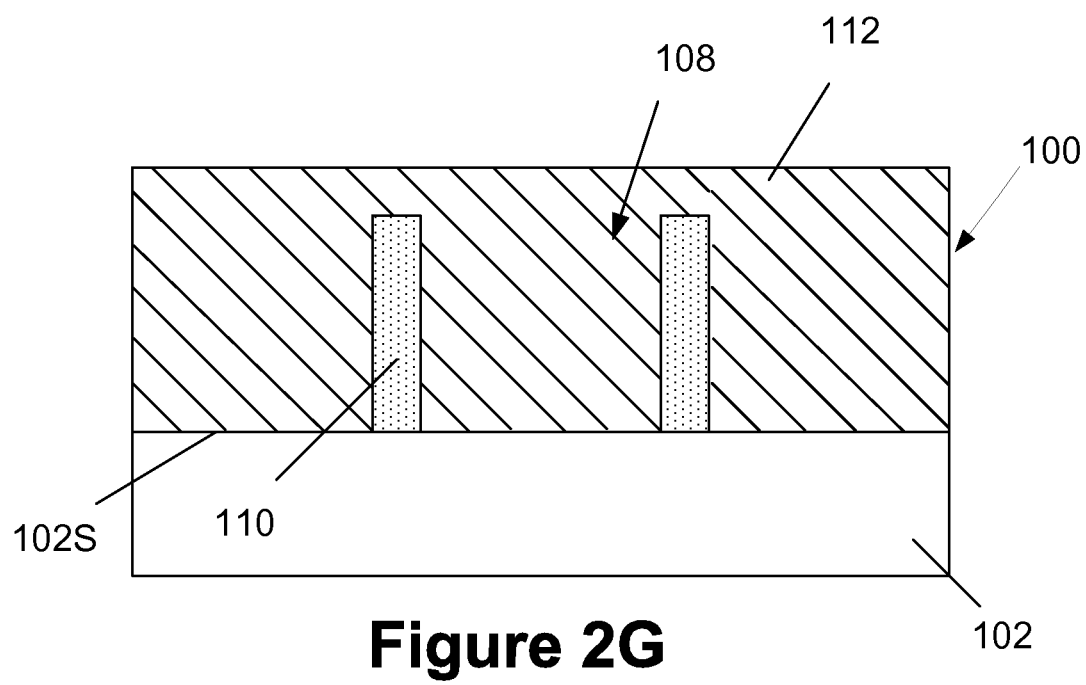

FIG. 2G depicts the device 100 after the patterned etch mask was removed and after a layer of insulating material 112, e.g., silicon dioxide, was formed so as to over-fill the trenches 108.

Figure 2H:
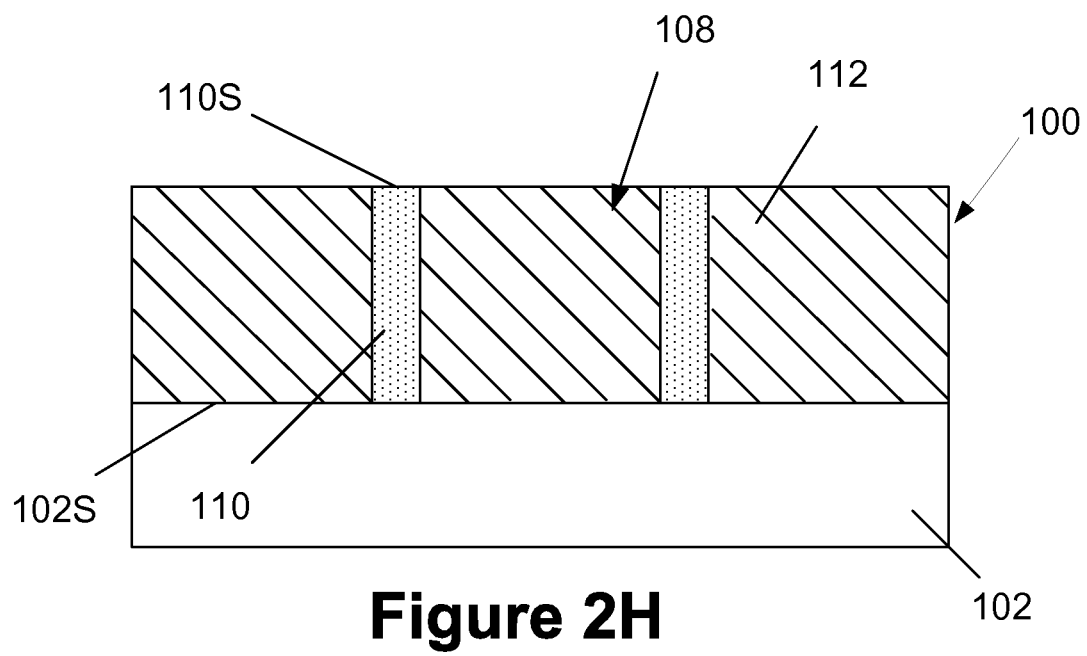

FIG. 2H depicts the device 100 after at least one process operation, such as a chemical mechanical polishing (CMP) process, was performed to planarize the upper surface of the layer of material 112 and thereby expose the upper surface 110S of the sacrificial fin structures 110. In some embodiments, rather than remove the patterned mask layer prior to the formation of the layer of insulating material 112, the layer of insulating material 112 may be deposited so as to overfill the trenches 108 and the patterned mask layer. Thereafter, one or more CMP processes may be performed to remove the patterned mask layer and portions of the layer of insulating material 112, stopping on the upper surface 110S of the sacrificial fin structures 110. Isolation regions (not depicted) and various fin-cutting activities (not shown) may have been performed at this point in the process flow as well.

Figure 2I:
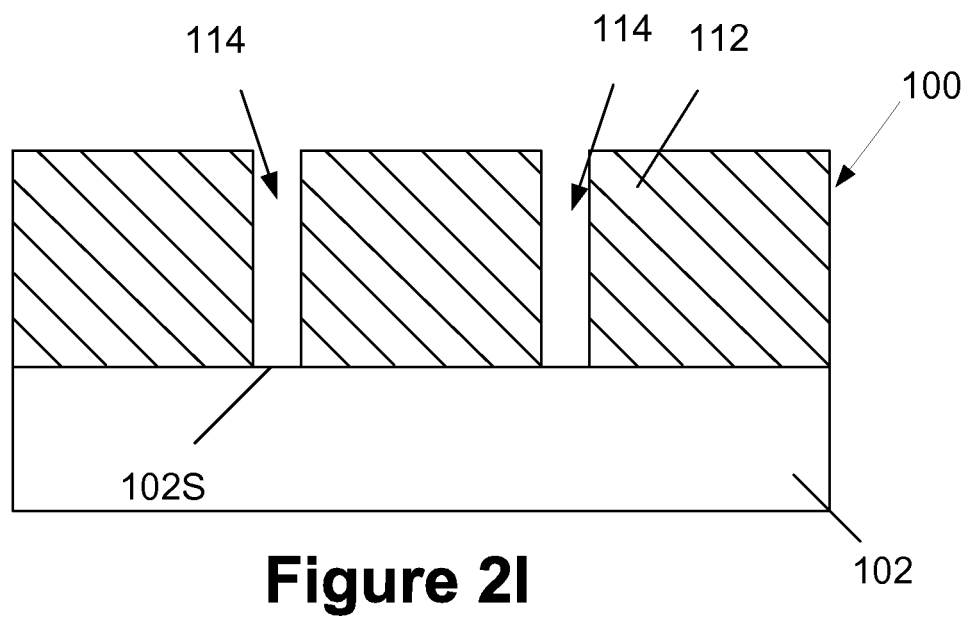

FIG. 2I depicts the device 100 after at least one end-pointed (untimed) etching process was performed to remove the sacrificial fin structures 110 and thereby define a plurality of replacement fin cavities 114. The formation of the replacement fin cavities 114 exposes the upper surface 102S of the substrate 102 within each of the replacement fin cavities 114. As was discussed in the background section of this application, many problems and issues arose using prior art techniques wherein a timed, recess etching process was used to reduce the height of the silicon fin prior to forming an alternative material on the recessed fin. Importantly, the presently disclosed invention eliminates the problems with performing such timed etching process, in that the etching process performed to remove the sacrificial fin structures 110 is not a timed etching process. Rather, the sacrificial fin removal process disclosed herein is end-pointed as it is based upon the etch selectivity between the material(s) of the sacrificial fins 110 and the substrate 102, which can be selected such that very precise control of the fin removal process may be achieved irrespective of the incoming width of the sacrificial fins 110.

Figure 2J:
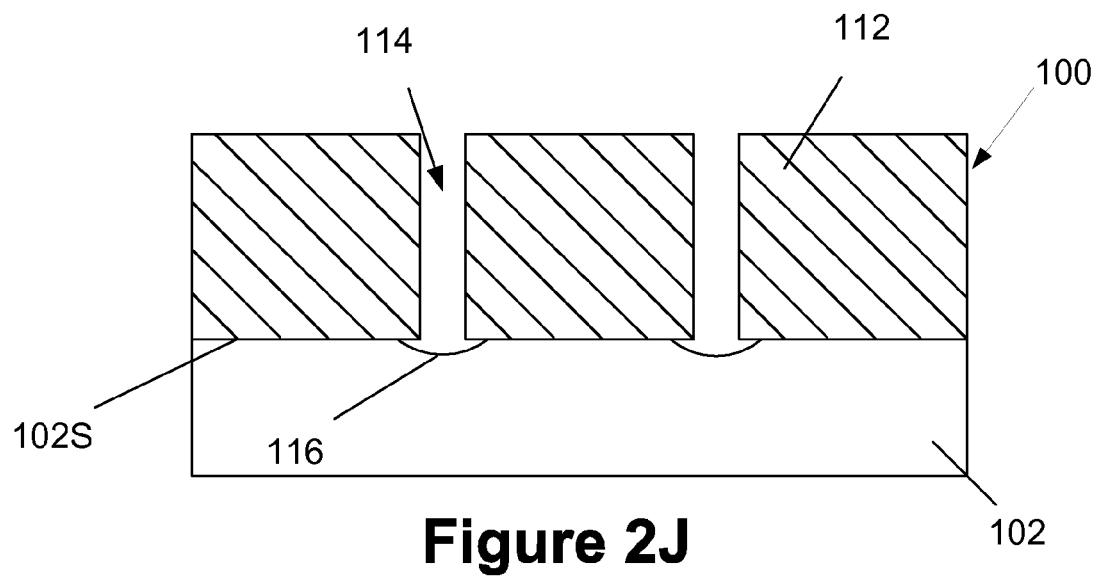

FIG. 2J depicts an alternative embodiment of the device 100, wherein, at some point after the sacrificial fin structures 110 are removed, an isotropic etching process was performed to "undercut" the bottom of the fin cavities 114 that were formed by removing the sacrificial fin structures 110, as described above. That is, in this embodiment, the fin cavities 114 have an undercut region 116 that is laterally wider than the nominal width of the fin cavities 114. By formation of these undercut regions 116, some or all of the defects formed when a replacement fin material is formed in the cavities 114 may be better trapped due to the formation of the undercut regions 116. For example, the formation of the undercut regions 116 may reduce or eliminate the formation and propagation of defects that move along the fin width.

Figure 2K:
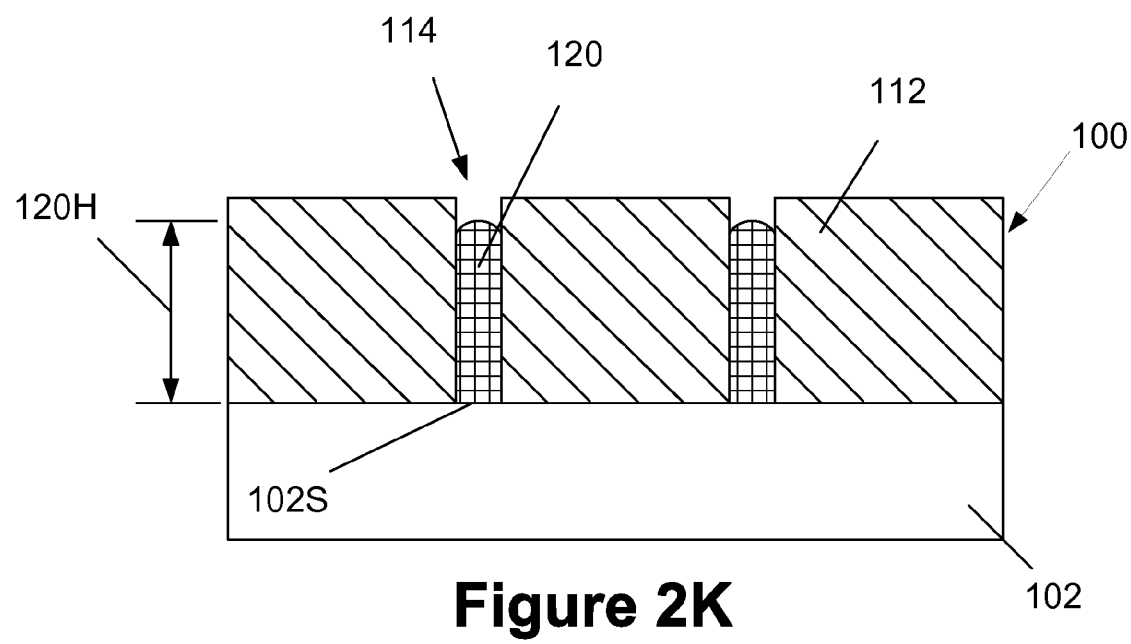

FIG. 2K depicts the device 100 after an epitaxially grown layer of semiconductor material that constitutes replacement fins 120 was formed in the fin cavities 114 using the exposed surface 102S of the substrate as a starting surface with respect to formation of the replacement fins 120. The replacement fins 120 may be formed to any desired height 120H, as shown in FIG. 2K. Although not depicted in the drawings, in some cases, if desired, the material for the replacement fins 120 may be formed such that it overfills the fin cavities 114. Thereafter, a CMP process may be performed to remove excess material positioned outside of the fin cavities 114 above the layer of insulating material 112. The replacement fins 120 may be formed using traditional epitaxial deposition tools and techniques, and they may be formed to any desired thickness. The replacement fins 120 may be made of a variety of different materials, e.g., silicon, silicon germanium, a III-V material or compounds thereof.

Figure 2L:
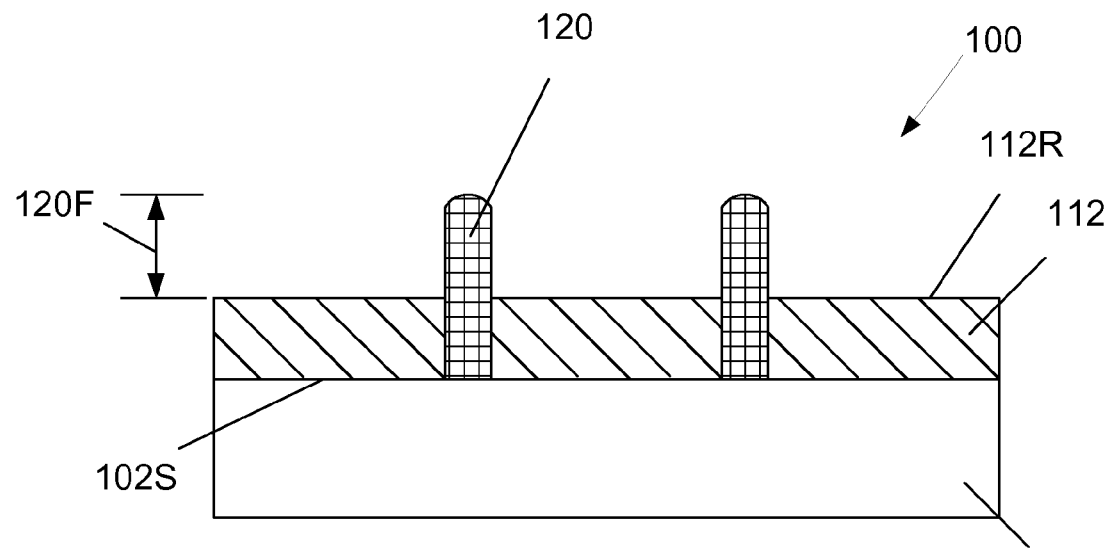

FIG. 2L depicts the device 100 after a recess etching process was performed on the layer of insulating material 112 to reduce its thickness and thereby result in the layer of insulating material 112 having a recessed surface 112R. The recessed surface 112R of the layer of insulating material 112 essentially defines the final active fin height 120F of the replacement fins 120. The final active fin height 120F may vary depending upon the particular application and, in one illustrative embodiment, may range from about 20-50 nm.

Figure 2M:
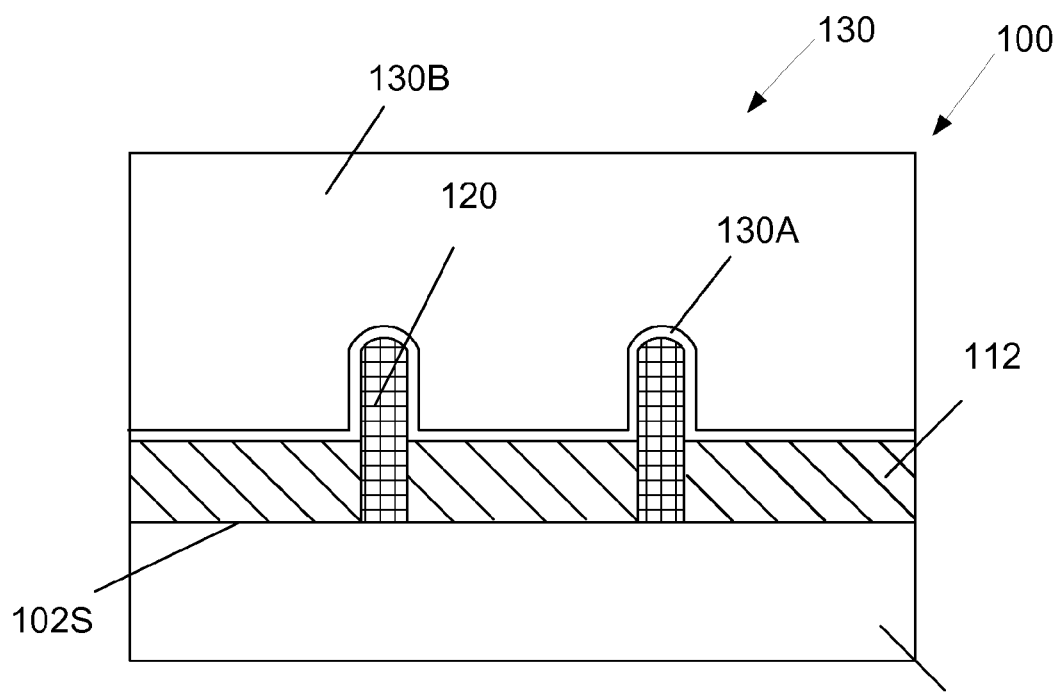

At the point of processing depicted in FIG. 2L, the illustrative FinFET device 100 may be completed using traditional fabrication techniques. For example, FIG. 2M depicts the device 100 after an illustrative gate structure 130 has been formed for the device 100. In one illustrative embodiment, the schematically depicted gate structure 130 includes an illustrative gate insulation layer 130A and an illustrative gate electrode 130B. The gate insulation layer 130A may be comprised of a variety of different materials, such as, for example, silicon dioxide, a so-called high-k (k greater than 10) insulation material (where k is the relative dielectric constant), etc. Similarly, the gate electrode 130B may also be of a material such as polysilicon or amorphous silicon, or it may be comprised of one or more metal layers that act as the gate electrode 130B. As will be recognized by those skilled in the art after a complete reading of the present application, the gate structure 130 of the device 100 depicted in the drawings, i.e., the gate insulation layer 130A and the gate electrode 130B, is intended to be representative in nature. That is, the gate structure 130 may be comprised of a variety of different materials and it may have a variety of configurations, and the gate structure 130 may be made using either the so-called "gate-first" or "replacement gate" techniques.

As will be appreciated by those skilled in the art, one illustrative method disclosed herein includes, among other things, forming a sacrificial fin structure above a semiconductor substrate using state-of-the-art fin patterning techniques, such as sidewall image transfer, forming a layer of insulating material around the sacrificial fin structure, removing the sacrificial fin structure in a very precise manner irrespective of the fin width so as to define a replacement fin cavity with substantially (and in some cases) uniform depth in the layer of insulating material that exposes an upper surface of the substrate, forming a replacement fin in the replacement fin cavity on the exposed upper surface of the substrate, recessing the layer of insulating material, and forming a gate structure around at least a portion of the replacement fin exposed above the recessed layer of insulating material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a sacrificial fin structure on a surface of a semiconductor substrate;
   forming a layer of insulating material around said sacrificial fin structure;
   performing at least one etching process to remove said sacrificial fin structure and thereby define a replacement fin cavity in said layer of insulating material that exposes an upper surface of said substrate;
   performing an isotropic etching process through said replacement fin cavity to remove portions of said substrate and thereby define a recess in said substrate under said replacement fin cavity that is wider than a width of said replacement fin cavity;
   forming a replacement fin in said recess and in said replacement fin cavity on said exposed upper surface of said substrate;
   recessing said layer of insulating material so as to thereby expose at least an upper portion of said replacement fin; and
   forming a gate structure around at least a portion of said replacement fin exposed above said recessed layer of insulating material.

2. The method of claim 1, wherein said sacrificial fin structure is comprised of a single layer of material.

3. The method of claim 1, wherein said sacrificial fin structure is comprised of multiple layers of material.

4. The method of claim 1, wherein said sacrificial fin structure is comprised of a layer of silicon dioxide positioned on said surface of said substrate and a layer of silicon nitride positioned on said layer of silicon dioxide.

5. The method of claim 1, wherein said replacement fin is comprised of one of silicon, silicon germanium, a III-V material or compounds thereof.

6. The method of claim 1, wherein forming said replacement fin in said replacement fin cavity comprises performing an epitaxial deposition process.

7. A method, comprising:
   forming at least one layer of a sacrificial fin material on a surface of a semiconductor substrate;
   patterning said at least one layer of sacrificial fin material so as to thereby define a sacrificial fin structure;
   forming a layer of insulating material around said sacrificial fin structure;
   performing at least one etching process to remove said sacrificial fin structure and thereby define a replacement fin cavity in said layer of insulating material that exposes an upper surface of said substrate;
   performing an isotropic etching process through said replacement fin cavity to remove portions of said substrate and thereby define a recess in said substrate under said replacement fin cavity that is wider than a width of said replacement fin cavity;
   performing an epitaxial deposition process to form a replacement fin in said recess and in said replacement fin cavity on said exposed upper surface of said substrate;
   recessing said layer of insulating material so as to thereby expose at least an upper portion of said replacement fin; and
   forming a gate structure around at least a portion of said replacement fin exposed above said recessed layer of insulating material.

8. The method of claim 7, wherein said at least one layer of a sacrificial fin material is a single layer of material.

9. The method of claim 7, wherein said at least one layer of a sacrificial fin material is comprised of multiple layers of material.

10. The method of claim 7, wherein forming said at least one layer of a sacrificial fin material on said surface of said semiconductor substrate comprises:
   forming a layer of silicon dioxide on said surface of said substrate; and forming a layer of silicon nitride on said layer of silicon dioxide.

11. The method of claim 7, wherein patterning said at least one layer of sacrificial fin material so as to thereby define said sacrificial fin structure comprises:
   forming a patterned etch mask layer above said at least one layer of sacrificial fin material; and
   performing at least one etching process though said patterned etch mask to remove portions of said at least one layer of sacrificial fin material so as to thereby define said sacrificial fin structure.

12. The method of claim 7, wherein said replacement fin is comprised of one of silicon, silicon germanium, a III-V material or compounds thereof.

13. A method, comprising:
   forming at least one layer of a sacrificial fin material on a surface of a semiconductor substrate;
   forming a patterned etch mask layer above said at least one layer of sacrificial fin material;
   performing at least one etching process though said patterned etch mask to remove portions of said at least one layer of sacrificial fin material so as to thereby define a sacrificial fin structure;
   forming a layer of insulating material around said sacrificial fin structure;
   performing at least one process operation to expose an upper surface of said sacrificial fin structure;
   performing at least one etching process to remove said sacrificial fin structure and thereby define a replacement fin cavity in said layer of insulating material that exposes an upper surface of said substrate;
   performing an isotropic etching process through said replacement fin cavity to remove portions of said substrate and thereby define a recess in said substrate under said replacement fin cavity that is wider than a width of said replacement fin cavity;
   performing an epitaxial deposition process to form a replacement fin in said recess and in said replacement fin cavity on said exposed upper surface of said substrate;
   recessing said layer of insulating material so as to thereby expose at least an upper portion of said replacement fin; and
   forming a gate structure around at least a portion of said replacement fin exposed above said recessed layer of insulating material.

14. The method of claim 13, wherein said at least one layer of a sacrificial fin material is comprised of multiple layers of material.

15. The method of claim 13, wherein forming said at least one layer of a sacrificial fin material on a surface of a semiconductor substrate comprises:
   forming a layer of silicon dioxide on said surface of said substrate; and
   forming a layer of silicon nitride on said layer of silicon dioxide.

16. The method of claim 13, wherein said replacement fin is comprised of one of silicon, silicon germanium, a III-V material or compounds thereof.

* * * * *